(12) United States Patent
Gaynes et al.

(10) Patent No.: US 8,293,141 B2
(45) Date of Patent: *Oct. 23, 2012

(54) ELECTRONIC DEVICE COMPRISING ELECTRICALLY STABLE COPPER FILLED ELECTRICALLY CONDUCTIVE ADHESIVE

(75) Inventors: Michael Gaynes, Vestal, NY (US); Jeffrey D. Gelorme, Burlington, CT (US); Luis J. Matienzo, Endicott, NY (US); Rebecca S. Northey, Portage, MI (US); Michael B. Vincent, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 223 days.

This patent is subject to a terminal disclaimer.

(21) Appl. No.: 12/032,645

(22) Filed: Feb. 16, 2008

(65) Prior Publication Data

US 2008/0230262 A1  Sep. 25, 2008

Related U.S. Application Data

(62) Division of application No. 11/072,193, filed on Mar. 4, 2005, now Pat. No. 7,763,188.

(51) Int. Cl.
*H01B 1/06* (2006.01)
*H01B 1/02* (2006.01)

(52) U.S. Cl. .......................... 252/512; 523/457; 525/422

(58) Field of Classification Search .................. 252/500, 252/511, 512; 148/23; 216/18; 523/457; 525/422

See application file for complete search history.

(56) References Cited

U.S. PATENT DOCUMENTS

| | | | | |
|---|---|---|---|---|
| 4,962,162 A * | 10/1990 | Kosuda et al. | ................. | 525/422 |
| 5,346,558 A * | 9/1994 | Mathias | ........................... | 148/23 |
| 5,382,384 A * | 1/1995 | Baigrie et al. | ................. | 252/511 |
| 5,683,627 A * | 11/1997 | Katayama et al. | ............. | 252/512 |
| 5,733,467 A * | 3/1998 | Kawakita et al. | ............... | 216/18 |
| 6,583,201 B2 * | 6/2003 | Cheng et al. | ..................... | 523/457 |
| 2004/0169162 A1 * | 9/2004 | Xiao et al. | ..................... | 252/500 |
| 2005/0230667 A1 * | 10/2005 | Komagata et al. | ............. | 252/500 |

* cited by examiner

*Primary Examiner* — Khanh Tuan Nguyen
(74) *Attorney, Agent, or Firm* — Nugent & Smith LLP; Theresa O'Rourke Nugent

(57) ABSTRACT

An electronic device including electronic circuit structures formed with an electrically conductive adhesive (ECA) with low and stable contact resistance including at least one melt-processable reactive resin, at least one reactive diluent, at least one rheological additive, at least one curing agent, at least one organic acid catalyst, and copper particles. The ECA is useful for filling vias, and bonding together components of electronic circuit structures.

13 Claims, 4 Drawing Sheets

Schematics of the copper contact resistance test samples.

Schematics of the copper contact resistance test samples.

ELECTRONIC DEVICE COMPRISING ELECTRICALLY STABLE COPPER FILLED ELECTRICALLY CONDUCTIVE ADHESIVE

CROSS REFERENCE TO RELATED APPLICATIONS

This is a divisional application of co-pending application Ser. No. 11/072,193 filed on Mar. 4, 2005.

BACKGROUND OF THE INVENTION

1. Field of the Invention

The present invention relates generally to an adhesive vehicle, to an electrically conductive adhesive prepared therefrom, to electronic circuit structures made with the electrically conductive adhesive, and to processes for the preparation thereof.

2. Description of Related Art

Isotropically electrically conductive adhesives (ECAs) have been used in electronic packaging for over 30 years, primarily as silver filled die attach adhesives. In the 1990's, considerable effort was made to evaluate the use of ECAs for surface mount technology (SMT). It was found that impact shock resistance of ECAs was poor. Card flexing or impact drops as little as two feet were sufficient to fracture ECA joints. Work was also completed in the area of flip chip ECA bumping and interconnection to organic substrates. In this case, the already commonly practiced underfilling provided mechanical reinforcement of ECA joints. Flip chip structures were found to withstand repeated six foot drop tests without measurable contact resistance change at the low million level. Silver was the filler of choice in the industry as it provided excellent conduction and its oxide is semiconducting. Non-semiconducting oxides were found to be highly resistive and resulted in higher contact resistance that would also increase with time. ECAs containing nickel or tin or copper provide much higher contact resistances initially with typical increases of 2 to 10 times during environmental stressing. Silver filled ECAs are used in niche applications for electrical grounding or attachment of components in very temperature sensitive applications. An emerging niche application for ECAs is via fill. Organic carriers require high density wiring and stacked via interconnection for full area array flip chips. Cores are made with vertical vias electrically connecting circuit lines and voltage and ground planes. These cores are then stacked and vias are aligned from one core to another. Lamination joins the cores as well as electrically connects the vias. Electrically conductive adhesives that are B-stageable are easily joined during lamination similar to the typically fiber or particle reinforced B-staged resin of the laminate core. The resulting structure is monolithic and, thus, stresses and strains are averaged over large areas and not highly concentrated at interconnect points. ECA filled vias are reinforced and encapsulated by the surrounding laminate structure.

However, there are undesirable attributes of silver filled ECAs. The best electrically performing silver filled ECAs use flakes that result in platelet stacks having multiple contact points. Flakes are not desirable for filling fine via holes that have diameters less than 100 µm and more especially less than 75 µm. During the via hole screening process, the flakes tend to stack up at the entry to the hole and block further ingress of material. Silver has high ion mobility that results in silver migration and shorting between circuits that are biased. Further, silver is a precious metal and thus, expensive.

Accordingly, there remains a need in the art to discover ECAs that overcome the disadvantages of the prior art, and, in particular, are useful for filling fine hole vias, and are less expensive than silver filled ECAs.

SUMMARY OF THE INVENTION

These and other objects were met with the present invention, which relates, in a first embodiment to an electrical device The invention relates to an electronic device comprised of an electronic structure which is a multilayer printed circuit structure of a plurality of planes, and a vertical interconnection between the planes, wherein the vertical interconnection is filled with an electrically conductive adhesive including at least one melt-processable reactive resin, at least one reactive diluent, at least one rheological additive, at least one curing agent, at least one organic acid catalyst and copper particles.

In a second embodiment, the electronic device is a computer.

In a third embodiment, the present invention relates to a process for forming an electronic device by forming an electronic circuit structure by connecting a plurality of electronic circuit structure components with an electrically conductive adhesive including at least one melt-processable reactive resin, at least one reactive diluent, at least one rheological additive, at least one curing agent, at least one organic acid catalyst and copper particles, and connecting a plurality of the electronic circuit structures.

In a fourth embodiment, a process for creating an electronic device is disclosed including forming an electronic circuit structure by connecting a plurality of electronic circuit structure components with an electrically conductive adhesive including at least one melt-processable reactive resin which is a thermosetting resin, thermoplastic resin or combinations thereof; at least one cycloaliphatic epoxy; at least one organic rheological thixotrope; at least one organic acid; at least one organic acid catalyst which is a fluorinated sulfonic acid, non-fluorinated sulfonic acid or combinations thereof; and spherical copper particles having an average particle diameter less than about 5 µm; and connecting a plurality of the electronic circuit structures.

BRIEF DESCRIPTION OF THE DRAWINGS

The invention will now be described in greater detail with reference to the drawings, wherein.

DETAILED DESCRIPTION OF THE INVENTION

Figure 1:
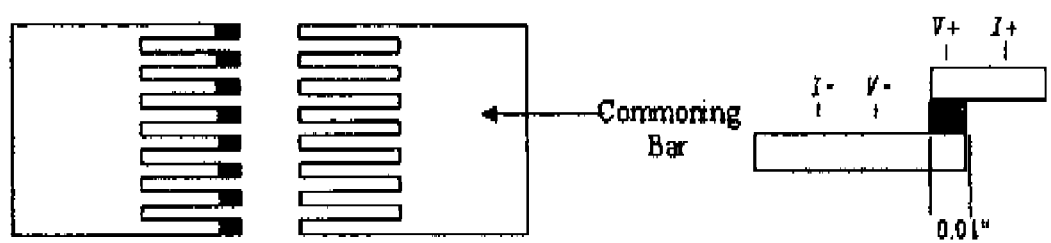
FIG. 1 is a schematic of copper contact resistance test samples.

It has been discovered that the inventive electronic device can be produced by connecting a plurality of electronic circuit structures having components connected or filled with an electrically conductive adhesive vehicle advantageously supporting copper particles, and that a mixture of the inventive adhesive vehicle and copper particles forms an electrically conductive adhesive that overcomes many of the disadvantages of the prior art. In particular, the inventive process for forming an electronic device includes forming an electronic circuit structure connected or filled with an electrically conductive adhesives providing excellent filling of fine hole vias, and the produced adhesives are much less expensive than the known silver-based counterparts, and, moreover, the inventive electrically conductive adhesives provide excellent bonding between components of electronic circuit structures.

The inventive electronic device includes a process for producing an electrically conductive adhesive in an uncured state which comprises at least one melt-processable reactive resin. This melt-processable reactive resin is, preferably, selected from the group consisting of thermosetting resins and thermoplastic resins. Thermosetting resins are well known in the prior art, and many should be useful in the present invention, but liquid cycloaliphatic epoxy resins are particularly preferred, especially ERL4221 from Union Carbide, and limonene oxide from Aldrich Chemical Co. Thermoplastic resins are likewise well known in the art, and many should also be useful in the present invention, especially those that can be converted into thermosetting resins if reacted, for example, solid phenoxy resins, which are particularly preferred. Among the phenoxy resins, PKHC from Interez is very particularly preferred. In general, the total amount of melt-processable reactive resin used to prepare the electrically conductive adhesive ranges from about 1 to about 20% by weight, preferably from about 2 to about 10% by weight, based on a total weight of the adhesive vehicle.

The inventive process includes producing an electrically conductive adhesive by mixing a reactive diluent which helps to dissolve the melt-processable reactive resin. In a particularly preferred embodiment, the melt-processable reactive resin is a combination of a liquid cycloaliphatic epoxy resin and a solid phenoxy resin. In this particularly preferred embodiment, the reactive diluent helps to dissolve the solid phenoxy resin in the liquid cycloaliphatic epoxy resin. Reactive diluents suitable for this purpose are especially cycloaliphatic epoxies, such as limonene oxide. The total amount of reactive diluents used in the process to prepare the electrically conductive adhesive ranges from about 1 to about 20% by weight, preferably from about 5 to about 15% by weight, based on a total weight of the adhesive vehicle.

The inventive process includes producing an electrically conductive adhesive by mixing at least one rheological additive. In one preferred embodiment, the Theological additive is an organic rheological additive, and especially an organic rheological thixotrope. Examples of suitable organic Theological thixotropes include castor oil derivatives, such as Thixcin R available from Rheox Company. The total amount of Theological additives used to prepare the electrically conductive adhesive ranges from about 0.5 to about 5% by weight, preferably from about 0.1 to about 2% by weight, based on a total weight of the adhesive vehicle.

The viscosity of the electrically conductive adhesive in an uncured state ranges, preferably, from about 30,000 centipoises (cps) to about 300,000 cps. In a particularly preferred embodiment, the viscosity ranges from about 30,000 cps to about 70,000 cps, especially from about 50,000 cps to about 60,000 cps.

The inventive process includes producing an electrically conductive adhesive by mixing at least one curing agent. In a preferred embodiment, the curing agent is an organic acids. Examples of suitable organic include fluorinated or non-fluorinated sulfonic acids or salts thereof, especially trifluoromethane sulfonic acid salts such as FC520 from 3M. The total amount of curing agents used to prepare the electrically conductive adhesive ranges from about 0.5 to about 5% by weight, preferably from about 0.8 to about 3% by weight, based on a total weight of the adhesive vehicle.

The inventive process includes producing an electrically conductive adhesive by mixing at least one organic acid catalyst. In general, the organic acid catalyst will be different than an organic acid selected as the curing agent. Suitable organic acid catalysts, in general, will be all those that are known to catalyze or are capable of catalyzing the self-ring opening reaction of an epoxide group. Examples of suitable organic acid catalysts include dicarboxylic acids, such as pimelic acid and the like. The total amount of organic acid catalysts used to prepare the electrically conductive adhesive ranges from about 0.0001 to about 2% by weight, preferably from about 0.001 to about 1% by weight, based on a total weight of the adhesive vehicle.

The inventive process includes producing an electrically conductive adhesive by mixing copper particles. In a preferred embodiment, the copper particles are generally spherical in shape, and have an average particle diameter less than about 5 µm, and, preferably, a maximum particle size of less than 12 µm. In a particularly preferred embodiment, the copper is obtained in powder form, and added to the inventive adhesive vehicle to result in an electrically conductive adhesive, wherein the copper particles amount to about 60% to about 90% by weight, preferably 80% to about 90% by weight, relative to the total weight of the electrically conductive adhesive. In an especially preferred embodiment, the copper particles amount to about 80% by weight of the total weight of the electrically conductive adhesive.

In an especially preferred embodiment, the inventive process includes forming a thixotropic paste suitable for extrusion printing to fill vias. A liquid cycloaliphatic epoxy resin is mixed with a solid phenoxy resin which imparts toughness to the cured adhesive. A reactive diluent is used to assist in dissolving the solid phenoxy resin in the cycloaliphatic epoxy resin. The reactive diluent may have either one or two or more reactive sites to provide control over cross-link density, Tg, temperature stability and mechanical properties such as modulus and elongation to break. Continuous mixing at temperatures as high as 70.degree. C. for several hours is used to further facilitate dissolving the solid resin. Alternatively, all ingredients can be combined and placed on a jar roller for several days. The mixed resin system is degassed under 28 inches of Hg to remove any air introduced during blending. Next, spherical copper powder with an average particle size between 1 and 5 µm and a maximum particle size of less than 12 µm is added to the resin mixture to yield a mixture that is 10 to 20% wt. resin and 80 to 90% wt. copper powder.

Copper powder with a minimal oxide layer (<50 Å) is especially preferred. Commercially available copper powders when packaged under an inert environment such as nitrogen or argon have oxide thickness <50 Å. Copper powder is handled under an inert environment and can be added directly to the formulation or optionally, the copper powder may be pretreated before combining with the resin. Pretreatment in ENTEK CU56 (benzotriazole from Enthone Inc.) will provide a thin, <50 Å passivation layer on the copper that is not continuous as indicated by X-Ray Photoelectron Spectroscopy (XPS) analysis. Optionally, a second pretreatment in an organic acid and alcohol solution deposits the organic acid at the surface of the copper particles. In the case of copper powder pretreated with CU56, the ensuing organic acid pretreatment results in the release of the CU56 coating and the formation of an organic acid salt as well as some reduction of CuO to $Cu_2O$ and $Cu_2O$ to Cu. In the case where no CU56 was used on the copper powder, the organic acid reacts directly with the copper powder surface to form an organic acid salt as well as some reduction of CuO to $Cu_2O$ and $Cu_2O$ to Cu.

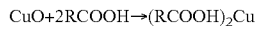

Pretreating the copper powder with CU56 provides short term stability to air exposure. If handling is conducted under an inert atmosphere from the manufactured package directly to the organic acid pretreatment or directly into the resin formulation, the CU56 pretreatment is optional. A further option is to forego the organic acid pretreatment and introduce the copper powder under an inert atmosphere directly into the resin formulation. In this case the organic acid is added as a discrete ingredient later in the formulation.

After the copper powder is added and wetted out under the inert atmosphere, high speed dispersive mixing for at least 15 minutes with a Cowles blade deagglomerates the powder. Mixing effectiveness is checked by doing Hegman fineness-of-grind testing to ensure adequate deagglomeration. Mixing under vacuum is preferred so as not to entrain air that could have the potential of oxidizing copper powder surfaces exposed from high speed mixing. When proper dispersion is achieved, tow speed distributive mixing (70 RPM) is performed for at least 30 minutes under vacuum. Finally, the curing agent and organic acid catalyst are added at 2 to 7% and 1 to 4% wt respectively. Mixing for 15 minutes under vacuum distributes the curative chemicals. Frozen storage at −40° C. prolongs storage life.

The inventive process includes producing an electrically conductive adhesive providing excellent filling of fine hole vias, and are much less expensive than the known silver-based counterparts, and, moreover, the electrically conductive adhesives provide excellent bonding between components of electronic circuit structures. In a preferred embodiment, the inventive process produces an electrically conductive adhesive exhibiting a bulk resistivity of less than $10^{-3}$ ohm-cm.

The inventive process includes producing an electrically conductive adhesive useful to bond components of electronic circuit structures. In a preferred embodiment, the invention relates to a process whereby a plurality of electronic circuit components are bonded together with the inventive electrically conductive adhesive. In an especially preferred embodiment, the electrically conductive adhesive is cured, particularly in stages.

In one especially preferred embodiment, the electronic circuit structure comprises a multilayer printed circuit structure having a plurality of planes with a vertical interconnection between the planes. In this embodiment, the vertical interconnection can be filled with the electrically conductive adhesive according to the present invention.

The electronic circuit structures according to the present invention find use in a variety of electronic devices. Non-limiting examples of such electronic devices include computers and electronic devices including computers, such as automobiles, airplanes, and the like, as well as camera equipment, computer equipment, such as printers, fax machines, scanners and the like, and household appliances, and personal electronic devices, such as CD-players, DVD-players, cassette tape recorders and the like.

The invention will now be described in greater detail with reference to the following non-limiting example:

EXAMPLE

A copper filled electrically conductive adhesive formulation was formulated as follows.

Resin Blend

A resin mix is made of cycloaliphatic epoxy, phenoxy resin and limonene oxide, according to the following recipe:
450 grams cycloaliphatic epoxy resin
100 grams solid phenoxy resin
290 grams limonene oxide
This resin blend was manipulated as follows:
1. Mix at 70° C. for eight hours
2. Cool to ambient temperature
3. Next an organic thixotrope, such as Thixcin R (hydrogenated castor oil derivative available from Rheox Company), is added. Add 8.4 grams Thixcin R
4. Heat to 72° C. while mixing at 30 RPM
5. Dispersive mix with Cowles blade at >2000 RPM for 20 minutes
6. Cool to 45° C. while mixing at 30 RPM
7. Cool to ambient temperature Copper Addition Next, copper powder is added and deagglomerated by high shear dispersive mixing with a Cowles blade, according to the following recipe:
32 grams of resin blend
168 grams of copper powder
The copper addition was performed as follows:
8. Add ½ copper powder under inert atmosphere
9. Wet out by hand
10. Dispersive mix for five minutes
11. Add second ½ copper powder under inert atmosphere
12. Wet out by hand
13. Dispersive mix for 30 minutes
14. Mix at 70 RPM for one hour under <28 in Hg vacuum Further Additions Low rpm distributive mixing follows where an amine curing agent is added along with the organic acid.
The distributive mixing was carried out as follows:
15. Add 1.6 grams 3M FC520 acid curing agent
16. Add 0.6 grams dicarboxylic acid
17. Mix at 70 RPM for 15 minutes under <28 in Hg vacuum Miniature copper lap shear joints were made to characterize contact resistance and stability. See FIG. 1. The sample geometry was 0.050 inches wide by 0.010 inches thick and extended 0.375 inches from a copper communing bus bar. Fourteen copper leads projected from the bus bar. Electrically conductive copper adhesive paste was dispensed on the tips of the copper leads. Since the intended use required "B" stage setting of the material, the copper coupon with dispensed adhesive was exposed to 70.degree. C. for 30 minutes. An identical copper coupon was mated to the first in lap manner and a pressure bar applied to deliver between 100 and 500 psi bonding pressure. The sample joints were cured under pressure.

Figure 2:
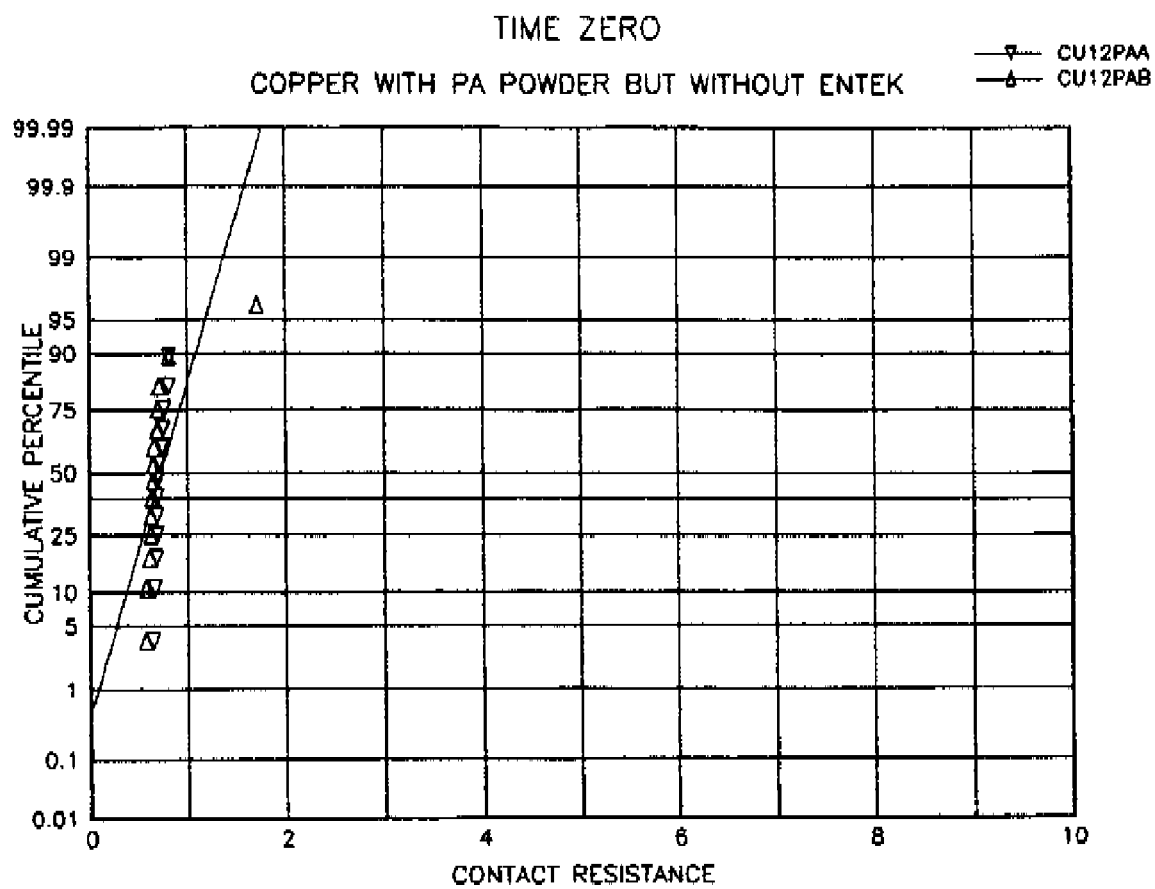
FIG. 2 is a graph of the contact resistance exhibited by a copper filled electrically conductive adhesive according to the present invention.
Figure 3:
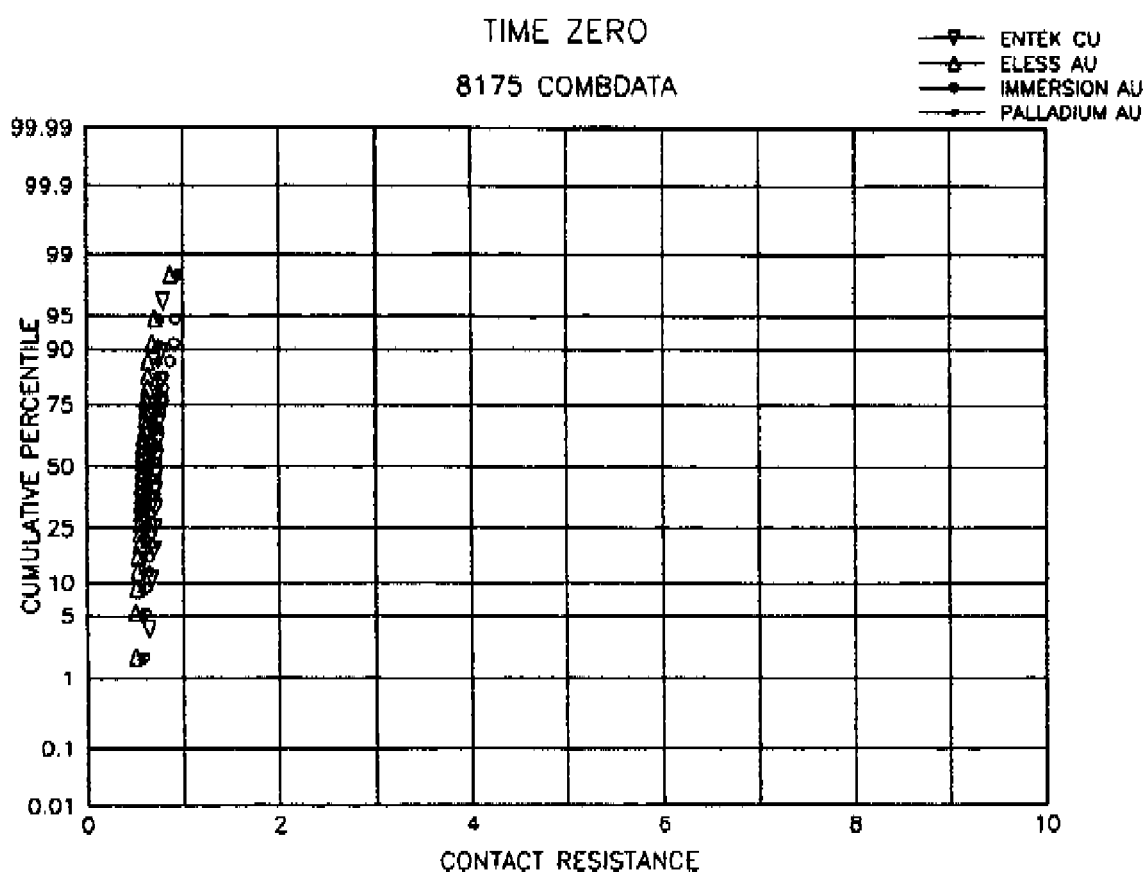
FIG. 3 is a graph comparing the contact resistance exhibited by a copper filled electrically conductive adhesive according to the present invention with a commercially available silver filled electrically conductive adhesive, Ablebond 8175 (available from Ablestik Laboratories)

Electrical joints were made with the material and compared to a commercially available high performance silver filled ECA, Ablebond 8175. The contact resistance by the electrically conductive and environmental stability of the copper system matched that of the silver filled system. See FIGS. 2 and 3.

Figure 4:
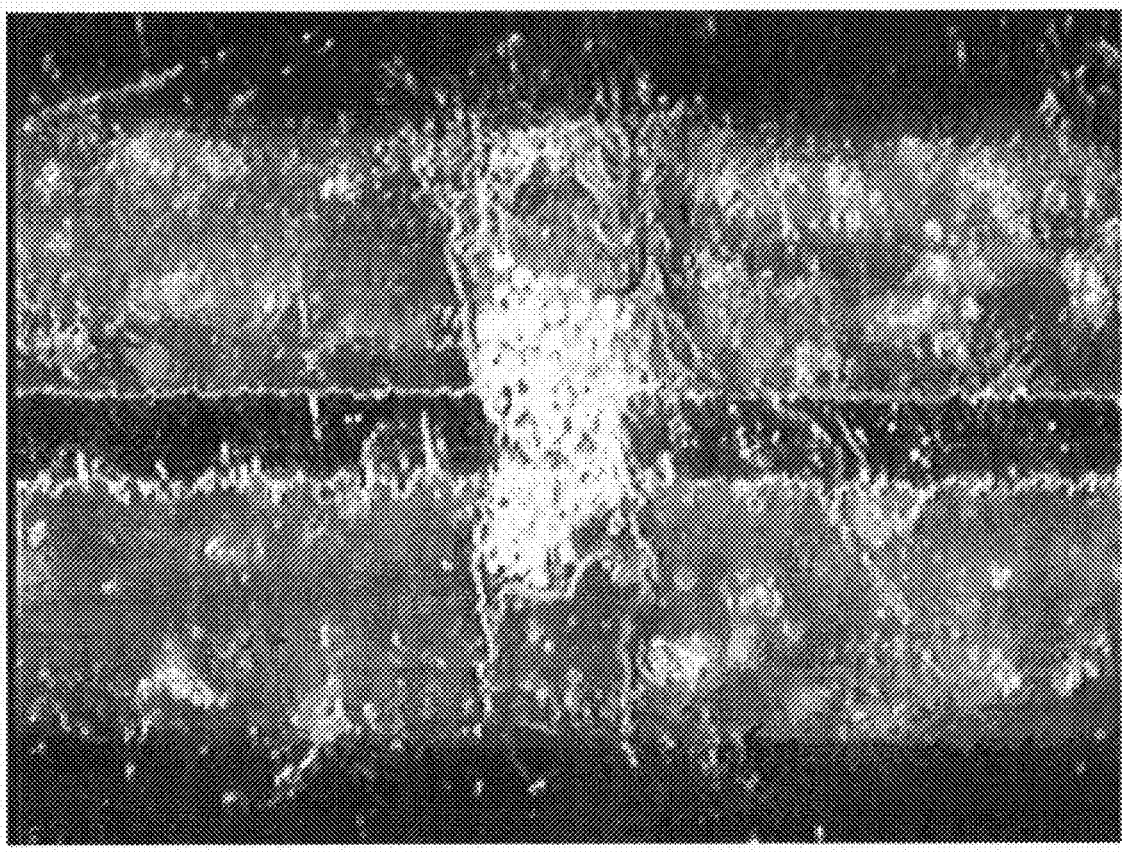
FIG. 4 is a photograph (courtesy of L. Jimarez) demonstrating the complete fill of a via hole with an electrically conductive paste according to the present invention.

The formulation was also used to fill 37, 50 and 75 μm diameter vias in a laminate core that was 125 μm thick. As shown in FIG. 4, the filling was complete to the center of the hole and uniform.

It should be understood that the preceding detailed description of the invention is merely a detailed description of one preferred embodiment or of a small number of preferred embodiments of the present invention and that numerous changes to the disclosed embodiment(s) can be made in accordance with the disclosure herein without departing from the spirit or scope of the invention. The preceding detailed description of the invention, therefore, is not meant to limit the scope of the invention in any respect. Rather, the scope of the invention is to be determined only by the appended issued claims and their equivalents.

We claim:

1. An electronic device comprising:
   (a) an electronic circuit structure, which is a multilayer printed circuit structure of a plurality of planes; and
   (b) a vertical interconnection between the planes, wherein the vertical interconnection is filled with an electrically conductive adhesive, comprising:
      (i) an adhesive vehicle, having 100% solids content, comprising
         (1) at least one melt-processable reactive resin in an amount of about 1 weight % to about 20 weight % based on the total weight of the vehicle, comprised of a combination of at least one thermoplastic resin and at least one thermosetting resin,
         (2) at least one reactive diluent in an amount of about 1 weight % to about 20 weight %,
         (3) at least one rheological additive in an amount of about 0.5 weight % to about 5 weight %,
         (4) at least one curing agent in an amount of about 0.5 weight % to about 5 weight %, and
         (5) at least one organic acid catalyst in an amount of about 0.0001 weight % to about 2 weight %; and
      (ii) spherically shaped uncoated copper particles having an average particle diameter about 1 μm to 5 μm in an amount of at least 80 weight % based on the total weight of the electrically conductive adhesive.

2. The electronic device according to claim 1, wherein the at least one thermosetting resin is a cycloaliphatic epoxy resin.

3. The electronic device according to claim 1, wherein the at least one thermoplastic resin is a phenoxy resin.

4. The electronic device according to claim 1, wherein the at least one reactive diluent is a cycloaliphatic epoxy.

5. The electronic device according to claim 1, wherein the at least one organic rheological additive is a castor oil derivative.

6. The electronic device according to claim 1, wherein the at least one curing agent is an organic acid.

7. The electronic device according to claim 1, wherein the organic acids catalyst is a fluorinated sulfonic acid, non-fluorinated sulfonic acid or combinations thereof.

8. The electronic device according to claim 1, wherein the at least one organic acid catalyst is a dicarboxylic acid.

9. The electronic device according to claim 1 wherein the device is a computer.

10. A computer comprising:
    (a) an electronic circuit structure, which is a multilayer printed circuit structure of a plurality planes; and
    (b) a vertical interconnection between the planes;
    wherein the vertical interconnection is filled with an electrically conductive adhesive comprising:
       (i) an adhesive vehicle, having 100% solids content, comprising
          (1) at least one cycloaliphatic epoxy resin and at least one phenoxy resin, combined in an amount of about 1 weight % to about 20 weight % based on the total weight of the vehicle,
          (2) at least one reactive diluent in an amount of about 1 weight % to about 20 weight %,
          (3) at least one rheological additive in an amount of about 0.5 weight % to about 5 weight %,
          (4) at least one curing agent in an amount of about 0.5 weight % to about 5 weight %, and
          (5) at least one organic acid catalyst in an amount of about 0.0001 weight % to about 2 weight %; and
       (ii) spherically shaped uncoated copper particles having an average particle diameter about 1 μm to 5 μm in an amount of at least 80 weight % based on the total weight of the electrically conductive adhesive.

11. An electronic device comprising:
    (a) an electronic circuit structure, which is a multilayer printed circuit structure of a plurality of planes; and
    (b) a vertical interconnection between the planes, wherein the vertical interconnection is filled with an electrically conductive adhesive comprising:
       (i) an adhesive vehicle, having 100% solids content, comprising (1) at least one cycloaliphatic epoxy resin and at least one phenoxy resin, combined in an amount of about 1 weight % to about 20 weight % based on the total weight of the vehicle,
          (2) at least one cycloaliphatic epoxy in an amount of about 1 weight % to about 20 weight %,
          (3) at least one organic rheological thixotrope in an amount of about 0.5 weight % to about 5 weight %,
          (4) at least one organic acid in an amount of about 0.5 weight % to about 5 weight %, and
          (5) at least one organic acid catalyst which is a fluorinated sulfonic acid, non-fluorinated sulfonic acid or combinations thereof in an amount of about 0.0001 weight % to about 2 weight %; and
       (ii) spherically shaped uncoated copper particles having an average particle diameter about 1 μm to 5 μm in an amount of at least 80 weight % based on the total weight of the electrically conductive adhesive.

12. The electronic device of claim 11, wherein the at least one organic acid catalyst is a dicarboxylic acid.

13. The electronic device of claim 11 wherein the electronic device is a computer.

* * * * *